（12） United States Patent
Aksak et al.

(10) Patent No.: US 12,240,154 B2
(45) Date of Patent: Mar. 4, 2025

(54) METHODS AND SYSTEMS FOR MAKING FIBRILLAR ADHESION STRUCTURES

(71) Applicant: Texas Tech University System, Lubbock, TX (US)

(72) Inventors: Burak Aksak, Lubbock, TX (US); Elliot Geikowsky, Lubbock, TX (US)

(73) Assignee: TEXAS TECH UNIVERSITY SYSTEM, Lubbock, TX (US)

( * ) Notice: Subject to any disclaimer, the term of this patent is extended or adjusted under 35 U.S.C. 154(b) by 860 days.

(21) Appl. No.: 17/335,679

(22) Filed: Jun. 1, 2021

(65) Prior Publication Data

US 2021/0370557 A1 Dec. 2, 2021

Related U.S. Application Data

(60) Provisional application No. 63/033,135, filed on Jun. 1, 2020.

(51) Int. Cl.
*B29C 43/56* (2006.01)
*F16B 5/07* (2006.01)
*B29L 31/00* (2006.01)
*H01L 21/683* (2006.01)

(52) U.S. Cl.
CPC .............. *B29C 43/56* (2013.01); *F16B 5/07* (2013.01); *B29L 2031/729* (2013.01); *B29L 2031/756* (2013.01); *H01L 21/683* (2013.01)

(58) Field of Classification Search
CPC .............................................. B29L 2031/729
See application file for complete search history.

(56) References Cited

U.S. PATENT DOCUMENTS

| 5,242,646 | A | * | 9/1993 | Torigoe | B29C 33/52 264/318 |
| 5,713,111 | A | * | 2/1998 | Hattori | B29C 33/0027 264/173.1 |
| 5,785,784 | A | * | 7/1998 | Chesley | B29C 43/46 51/297 |
| 6,287,665 | B1 | * | 9/2001 | Hammer | A44B 18/0061 264/210.2 |
| 6,470,540 | B2 | * | 10/2002 | Aamodt | B29C 43/28 24/304 |

(Continued)

FOREIGN PATENT DOCUMENTS

CN 102381679 A 3/2012

OTHER PUBLICATIONS

Geikowsky, Elliot. A New Generation of Nature-Inspired Micro Fibrillar Adhesive Structures with Improved Anisotropic Adhesion Performance. Diss. Texas Tech University, May 2020. (Year: 2020).*

(Continued)

*Primary Examiner* — Benjamin A Schiffman
(74) *Attorney, Agent, or Firm* — LOZA & LOZA, LLP; Kevin L. Soules

(57) ABSTRACT

A method, system, and apparatus for a fibrillar adhesion device comprises forming a stem mold, generating an array of at least one stems using the stem mold, forming a cap mold, generating an array of at least one caps using the cap mold, adhering the array of at least one stems to the array of at least one caps, and removing the cap mold wherein the resulting system comprise an array of at least one fibrillar adhesive structures.

14 Claims, 12 Drawing Sheets

(56) References Cited

U.S. PATENT DOCUMENTS

| | | | | |
|---|---|---|---|---|
| 7,601,284 | B2* | 10/2009 | Clune | A44B 18/0053 264/172.19 |
| 7,807,007 | B2* | 10/2010 | Tachauer | A61F 13/625 156/247 |
| 8,142,700 | B2* | 3/2012 | Sitti | G03F 7/0017 264/220 |
| 8,206,631 | B1* | 6/2012 | Sitti | B29C 39/10 264/250 |
| 8,709,323 | B2* | 4/2014 | Poulakis | B29C 33/0027 264/316 |
| 8,961,850 | B2* | 2/2015 | Wood | B32B 27/365 264/177.17 |
| 9,731,422 | B2 | 8/2017 | Sitti et al. | |
| 9,963,616 | B2 | 5/2018 | Menon et al. | |
| 10,307,941 | B2 | 6/2019 | Sitti et al. | |
| 10,351,733 | B2 | 7/2019 | Hensel et al. | |
| 2014/0010988 | A1 | 1/2014 | Sitti et al. | |
| 2015/0158206 | A1 | 6/2015 | Sitti et al. | |
| 2015/0368519 | A1 | 12/2015 | Sitti et al. | |

OTHER PUBLICATIONS

Murphy, Michael P., Burak Aksak, and Metin Sitti. "Adhesion and anisotropic friction enhancements of angled heterogeneous microfiber arrays with spherical and spatula tips." Journal of Adhesion Science and Technology 21.12-13 (Jul. 30, 2007): 1281-1296. (Year: 2007).*

Geikowsky, Elliot, Serdar Gorumlu, and Burak Aksak. "The effect of flexible joint-like elements on the adhesive performance of nature-inspired bent mushroom-like fibers." Beilstein journal of nanotechnology 9.1 (Nov. 19, 2018): 2893-2905. (Year: 2018).*

Geikowsky, E., and Burak Aksak. "Bioinspired fibrillar adhesives with shape-controlled off-center caps for switchable and directional adhesion." Bioinspiration & Biomimetics 15.5 (Jul. 20, 2020): 056007. (Year: 2020).*

Lee, Sung Ho et al. "Continuous Fabrication of Wide-Tip Microstructures for Bio-Inspired Dry Adhesives via Tip Inking Process", Journal of Chemistry, vol. 2019, Article ID 4827918, Feb. 2019, 5 pages.

Gorb, S. et al. "Biomimetic mushroom-shaped fibrillar adhesive microstructure", J. R. Soc. Interface (2007) 4, 271-275, 5 pgs.

Bauer, Christina T. et al. "Hierarchical macroscopic fibrillar adhesives: in situ study of buckling and adhesion mechanisms on wavy substrates", (2015), 18 pgs.

Jeong, Hoon Eui et al. "UV-assisted capillary force lithography for engineering biomimetic multiscale hierarchical structures: From lotus leaf to gecko foot hairs", Nanoscale, 2009, 1, pp. 331-338.

Kim, Tae-Il et al. "Stooped Nanohairs: Geometry-Controllable, Unidirectional, Reversible, and Robust Gecko-like Dry Adhesive", Adv. Mater. 2009, 21, pp. 2276-2281.

Aksak, Burak et al. "The optimal shape of elastomer mushroom-like fibers for high and robust adhesion", Beilstein J. Nanotechnol. 2014, 5, pp. 630-638.

Aksak, Burak, "A design methodology for biologically inspired dry fibrillar adhesives", Sep. 2008, 24 pgs.

* cited by examiner

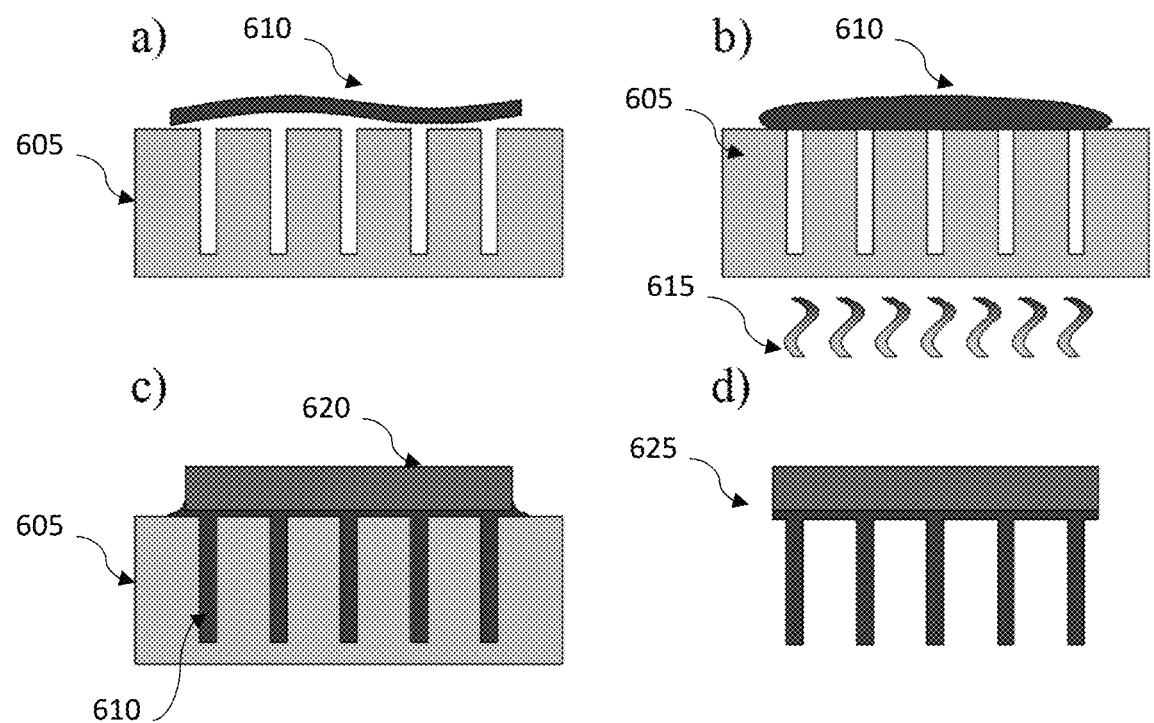
FIG. 6A
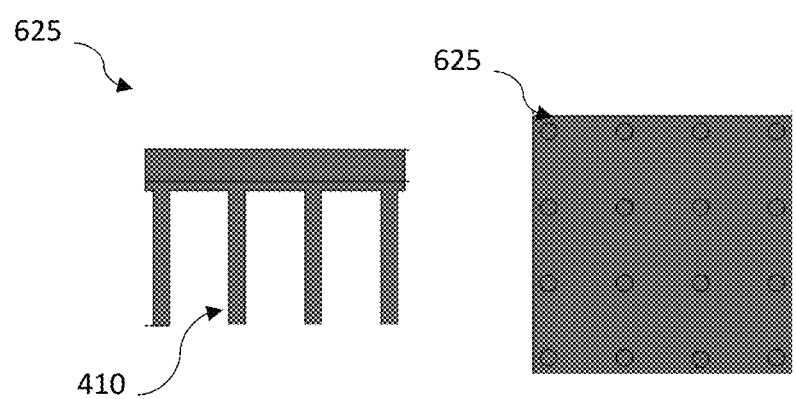
FIG. 6B                    FIG. 6C

METHODS AND SYSTEMS FOR MAKING FIBRILLAR ADHESION STRUCTURES

CROSS REFERENCE TO RELATED PATENT APPLICATIONS

This patent application claims the priority and benefit under 35 U.S.C. § 119(e) of U.S. Provisional Patent Application Ser. No. 63/033,135, filed Jun. 1, 2020, entitled "METHODS AND SYSTEMS FOR MAKING FIBRILLAR ADHESION STRUCTURES." U.S. Provisional Patent Application Ser. No. 63/033,135 is herein incorporated by reference in its entirety.

TECHNICAL FIELD

Embodiments are generally related to the field of adhesive structures, including, but not limited to, micro/nano structures. Embodiments are also related to cap and stem arrangements of micro/nano structures. Embodiments are further related to structures formed to improve grip. Embodiments are also related to fabrication of such structures. Embodiments are further related to methods and systems for making adhesive structures and/or off-center capped adhesive structures and/or arrays of such structures. Embodiments are further related to methods and systems for customizing the spatial relationship of the caps and stems of adhesive structures and arrays of adhesive structures.

BACKGROUND

Adhesive materials which do not rely on liquids or pressure differentials are highly coveted in disciplines ranging from electronic assembly to vehicle construction. For example, computer chip manufacturing requires clean-room handling to prevent contamination. Synthetic adhesive materials enable fabrication in clean room scenarios where clean grasping is required. Additionally, for certain application directional gripping may be desirable for fast and damage free handling and transportation of fragile parts such as computer chips.

Currently, synthetic fibers exist that are utilized to grasp objects. However, design aspects of these devices are limited because the techniques used for their fabrication are limited. One such limitation is that it is very difficult to customize the relative relationship of the cap of such a structure on the stem. Using present technology, the stems are configured as arrays of straight stems with caps uniformly centered on the stems.

In most such approaches, there is no way to control the shape or placement of the tip with respect to the stem, and the material for the tip plates is restricted to the material of the stem. Because of the nature of the fabrication, adhesive tip features are thus, symmetrical with respect to the stem. Axisymmetric caps, develop a symmetric contact stress regime at the interface with the target surface. Independent of the loading direction, it is extremely difficult to nucleate and propagate a crack to drive detachment, because the shape of the tip is designed to distribute load evenly and even eliminate stress singularities at the interface. As such, these types of geometries are very difficult to detach from an adhering surface as they are designed to distribute load evenly and resist detachment irrespective of the loading direction. Moreover, the high amount of energy required for detachment is mainly a consequence of the extensive fiber deformation and high adhesive strength. Excessive amounts of deformation can lead to permanent deformation of the adhesive structure as well as material fatigue after repeated use.

Accordingly, there is a need for systems and methods that can be used to provide adhesive structures with asymmetric relationships between the associated stems and caps, with anisotropic adhesive properties, where the adhesive structures provide both strong adhesion in a preferred direction and releases easily in another, as disclosed herein.

SUMMARY

The following summary is provided to facilitate an understanding of some of the innovative features unique to the embodiments disclosed and is not intended to be a full description. A full appreciation of the various aspects of the embodiments can be gained by taking the entire specification, claims, drawings, and abstract as a whole.

It is, therefore, one aspect of the disclosed embodiments to provide adhesion structures.

It is another aspect of the disclosed embodiments to provide structures formed to improve grip.

It is another aspect of the disclosed embodiments to provide methods for fabrication of such structures.

It is another aspect of the disclosed embodiments to provide methods and systems for making fibrillar adhesive structures with stems and asymmetrically aligned caps.

It will be appreciated that the methods and systems can be achieved according to the embodiments disclosed herein. For example, in certain embodiments, a fabrication method comprises forming a stem mold, generating an array of at least one stems using the stem mold, forming a cap mold, generating an array of at least one caps using the cap mold, adhering the array of at least one stems to the array of at least one caps, and removing the cap mold wherein the resulting system comprise an array of at least one fibrillar adhesive structures. In an embodiment, the method further comprises aligning the array of at least one stem to contact the at least one cap at a desired location on the cap. In an embodiment, a spacing between each of the at least one stem in the array of at least one stem is substantially the same as the spacing between each of the at least one caps in the array of at least one caps. In an embodiment, generating an array of at least one caps further comprises distributing a cap material into the cap mold while the cap mold is on a substantially horizontal surface, reorienting the cap mold into a substantially vertical position, wherein excess cap material drains off the cap mold, and reorienting the cap mold back into a substantially horizontal position. In an embodiment, the method further comprises subjecting the cap mold to a vacuum. In an embodiment, generating an array of at least one stem using the stem mold further comprises placing a stem material on the stem mold, heating the stem mold, and compressing the stem material with a peg. The method further comprises curing the stem material in the stem mold. In an embodiment, the method further comprises curing the array of at least one fibrillar adhesive structures after the array of at least one stems is adhered to the array of at least one caps. In an embodiment, the array of at least one stems comprises the peg with the at least one stems extend therefrom. In an embodiment, the array of at least one stems comprises one of at least one curved stem and at least one straight stem.

In an embodiment, a gripping system comprises an array of at least one stems, the array of at least one stems being cast from a stem mold and an array of at least one caps bound to the array of at least one stems, the array of at least one caps being cast from a cap mold wherein the caps are asymmetrically aligned on the stems. In an embodiment, each of the array of at least one stems comprises one of at least one curved stem and at least one straight stem. In an embodiment, the system further comprises a peg, the peg comprising a substrate upon which the array of at least one stems are mounted. In an embodiment, the peg comprises an acrylic peg. In an embodiment, each stem in the array of at least one stem comprises a thermoplastic urethane stem. In an embodiment, the cap in the array of at least one cap comprises a two-compound resin and hardener liquid polyurethane.

In another embodiment a method for fabricating fibrillar adhesive structures comprises fabricating a stem mold, the stem mold comprising a wafer with at least one stem shaped formation, fabricating a cap mold, the cap mold comprising a wafer with at least one cap shaped depression, creating an array of at least one stems using the stem mold, creating an array of at least one caps using the cap mold, aligning the centers of the at least one stems in the array of at least one stems to a desired position on the at least one cap in the array of at least one caps, bonding the at least one stem in the array of at least one stems to the at least one cap in the array of at least one caps to form the fibrillar adhesive structure, and curing the fibrillar adhesive structure. In an embodiment, creating an array of at least one caps further comprises distributing a cap material into the cap mold while the cap mold is on a substantially horizontal surface, reorienting the cap mold into a substantially vertical position, wherein excess cap material drains off the cap mold, and reorienting the cap mold back into a substantially horizontal position. In an embodiment, generating an array of at least one stems using the stem mold further comprises placing a stem material on the stem mold, heating the stem mold, compressing the stem material with a peg, and curing the stem material in the stem mold. In an embodiment, the method further comprises selecting the cap material and the stem material to be the same material.

BRIEF DESCRIPTION OF THE FIGURES

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

FIG. 6A depicts a block diagram of a fabrication method for stems, in accordance with the disclosed embodiments;

FIG. 6B depicts an array of stems, in accordance with the disclosed embodiments;

FIG. 6C depicts an array of stems, in accordance with the disclosed embodiments;

DETAILED DESCRIPTION

Figure 1:
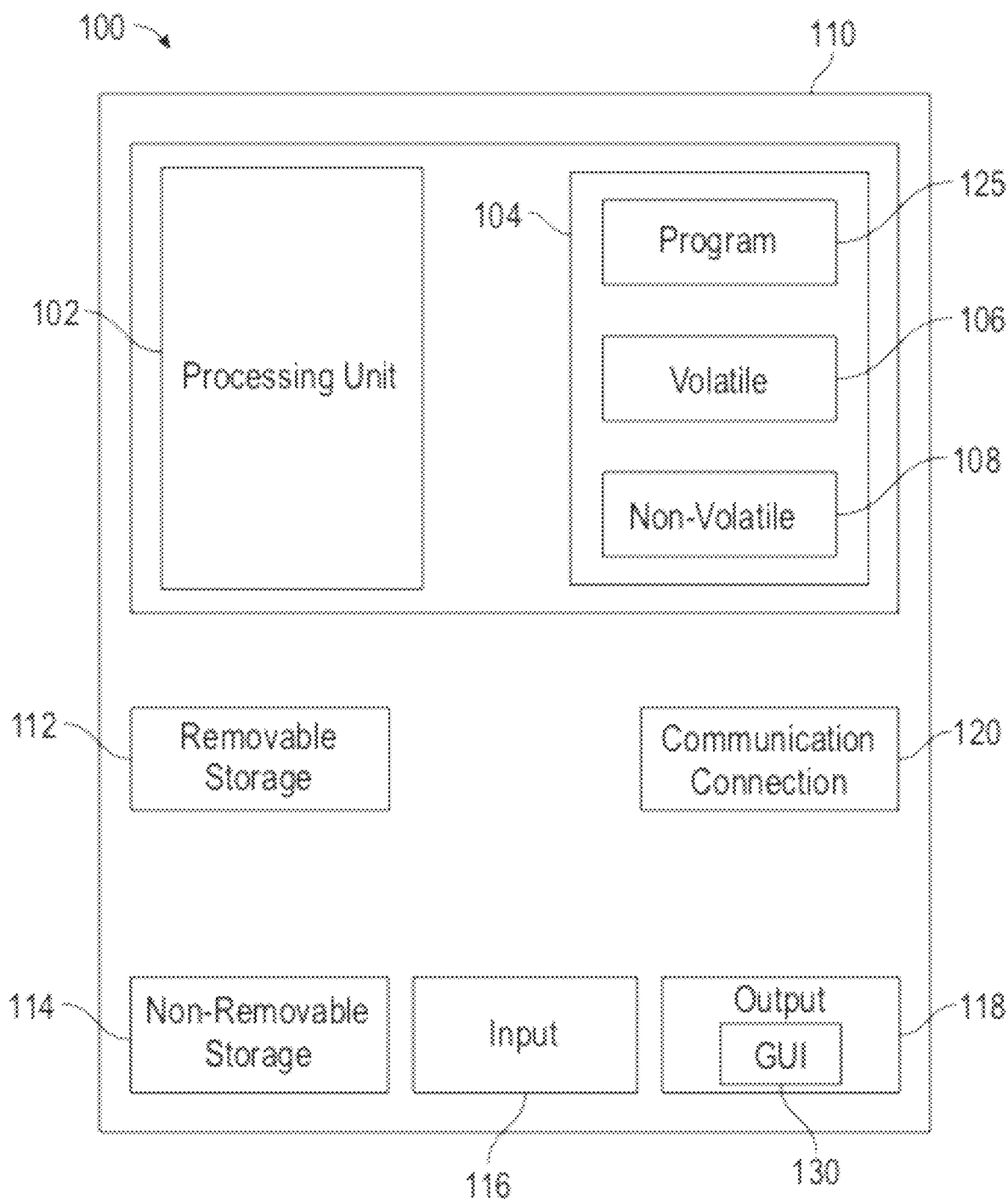
FIG. 1 depicts a block diagram of a computer system which is implemented in accordance with the disclosed embodiments.

The particular values and configurations discussed in the following non-limiting examples can be varied, and are cited merely to illustrate one or more embodiments, and are not intended to limit the scope thereof.

Example embodiments will now be described more fully hereinafter, with reference to the accompanying drawings, in which illustrative embodiments are shown. The embodiments disclosed herein can be embodied in many different forms and should not be construed as limited to the embodiments set forth herein; rather, these embodiments are provided so that this disclosure will be thorough and complete, and will fully convey the scope of the embodiments to those skilled in the art. Like numbers refer to like elements throughout.

The terminology used herein is for the purpose of describing particular embodiments only and is not intended to be limiting. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Throughout the specification and claims, terms may have nuanced meanings suggested or implied in context beyond an explicitly stated meaning. Likewise, the phrase "in one embodiment" as used herein does not necessarily refer to the same embodiment and the phrase "in another embodiment" as used herein does not necessarily refer to a different embodiment. It is intended, for example, that claimed subject matter include combinations of example embodiments in whole or in part.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It is contemplated that any embodiment discussed in this specification can be implemented with respect to any method, kit, reagent, or composition of the invention, and vice versa. Furthermore, compositions of the invention can be used to achieve methods of the invention.

It will be understood that particular embodiments described herein are shown by way of illustration and not as limitations of the invention. The principal features of this invention can be employed in various embodiments without departing from the scope of the invention. Those skilled in the art will recognize, or be able to ascertain using no more than routine experimentation, numerous equivalents to the specific procedures described herein. Such equivalents are considered to be within the scope of this invention and are covered by the claims.

The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or the alternatives are mutually exclusive, although the disclosure supports a definition that refers to only alternatives and "and/or." Throughout this application, the term "about" is used to indicate that a value includes the inherent variation of error for the device, the method being employed to determine the value, or the variation that exists among the study subjects.

As used in this specification and claim(s), the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, AB, BBC, AAABCCCC, CBBAAA, CABABB, and so forth. The skilled artisan will understand that typically there is no limit on the number of items or terms in any combination, unless otherwise apparent from the context.

All of the compositions and/or methods disclosed and claimed herein can be made and executed without undue experimentation in light of the present disclosure. While the compositions and methods of this invention have been described in terms of preferred embodiments, it will be apparent to those of skill in the art that variations may be applied to the compositions and/or methods and in the steps or in the sequence of steps of the method described herein without departing from the concept, spirit and scope of the invention. All such similar substitutes and modifications apparent to those skilled in the art are deemed to be within the spirit, scope and concept of the invention as defined by the appended claims.

Figure 2:
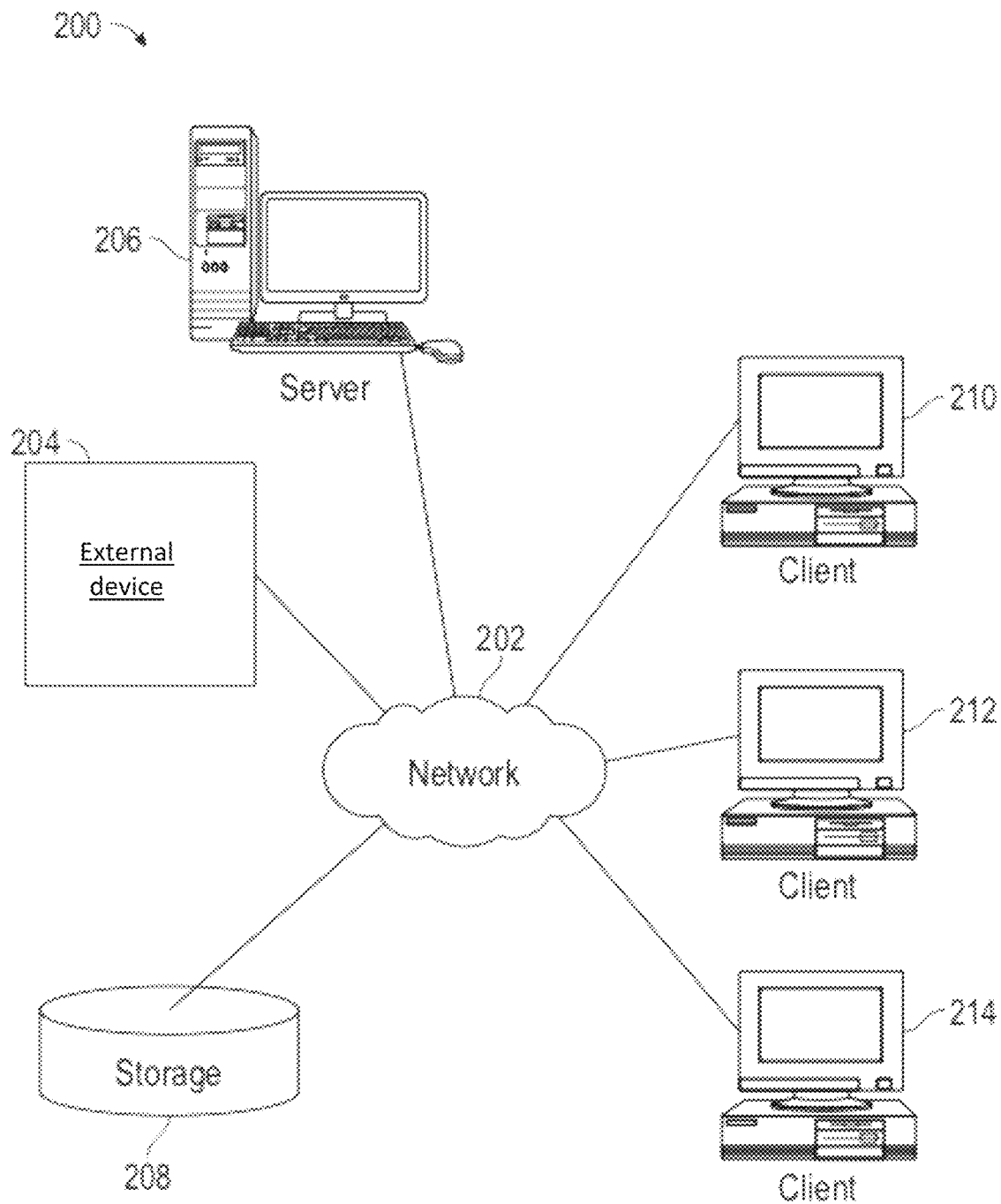
FIG. 2 depicts a graphical representation of a network of data-processing devices in which aspects of the present embodiments may be implemented.
Figure 3:
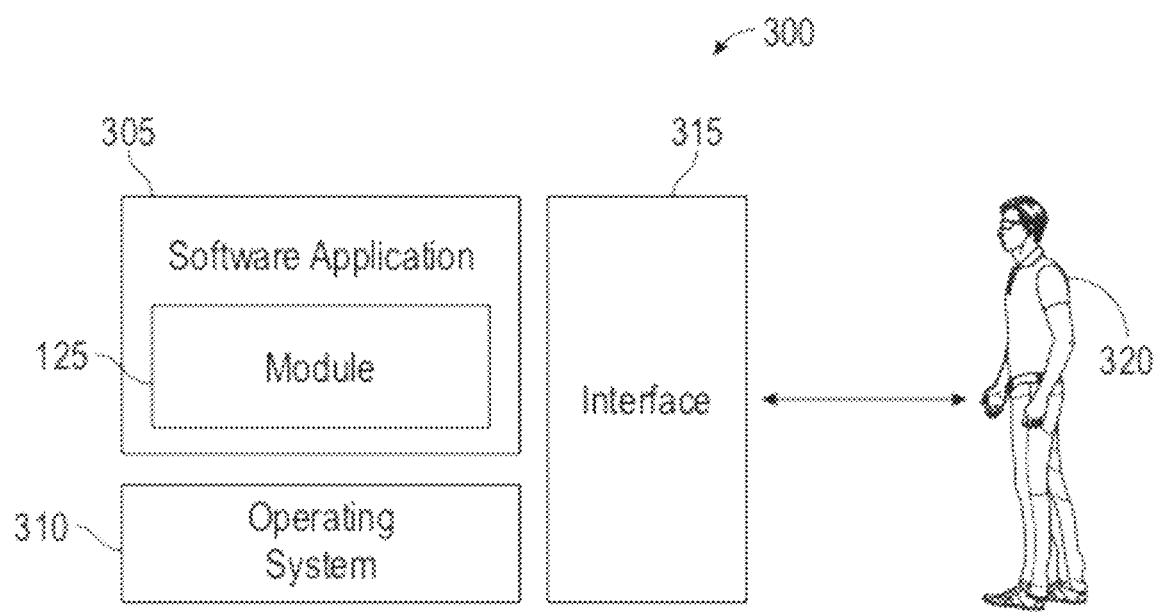
FIG. 3 depicts a computer software system for directing the operation of the data-processing system depicted in FIG. 1, in accordance with an example embodiment.

FIGS. 1-3 are provided as exemplary diagrams of data-processing environments in which embodiments of the present embodiments may be implemented. It should be appreciated that FIGS. 1-3 are only exemplary and are not intended to assert or imply any limitation with regard to the environments in which aspects or embodiments of the disclosed embodiments may be implemented. Many modifications to the depicted environments may be made without departing from the spirit and scope of the disclosed embodiments.

A block diagram of a computer system 100 that executes programming for implementing parts of the methods and systems disclosed herein is shown in FIG. 1. A computing device in the form of a computer 110 configured to interface with controllers, peripheral devices, and other elements disclosed herein may include one or more processing units 102, memory 104, removable storage 112, and non-removable storage 114. Memory 104 may include volatile memory 106 and non-volatile memory 108. Computer 110 may include or have access to a computing environment that includes a variety of transitory and non-transitory computer-readable media such as volatile memory 106 and non-volatile memory 108, removable storage 112 and non-removable storage 114. Computer storage includes, for example, random access memory (RAM), read only memory (ROM), erasable programmable read-only memory (EPROM) and electrically erasable programmable read-only memory (EEPROM), flash memory or other memory technologies, compact disc read-only memory (CD ROM), Digital Versatile Disks (DVD) or other optical disk storage, magnetic cassettes, magnetic tape, magnetic disk storage, or other magnetic storage devices, or any other medium capable of storing computer-readable instructions as well as data including image data.

Computer 110 may include, or have access to, a computing environment that includes input 116, output 118, and a communication connection 120. The computer may operate in a networked environment using a communication connection 120 to connect to one or more remote computers, remote sensors and/or controllers, detection devices, handheld devices, multi-function devices (MFDs), speakers, mobile devices, tablet devices, mobile phones, Smartphone, or other such devices. The remote computer may also include a personal computer (PC), server, router, network PC, RFID enabled device, a peer device or other common network node, or the like. The communication connection may include a Local Area Network (LAN), a Wide Area Network (WAN), Bluetooth connection, or other networks. This functionality is described more fully in the description associated with FIG. 2 below.

Output 118 is most commonly provided as a computer monitor, but may include any output device. Output 118 and/or input 116 may include a data collection apparatus associated with computer system 100. In addition, input 116, which commonly includes a computer keyboard and/or pointing device such as a computer mouse, computer track pad, or the like, allows a user to select and instruct computer system 100. A user interface can be provided using output 118 and input 116. Output 118 may function as a display for displaying data and information for a user, and for interactively displaying a graphical user interface (GUI) 130.

Note that the term "GUI" generally refers to a type of environment that represents programs, files, options, and so forth by means of graphically displayed icons, menus, and dialog boxes on a computer monitor screen. A user can interact with the GUI to select and activate such options by directly touching the screen and/or pointing and clicking with a user input device 116 such as, for example, a pointing device such as a mouse, and/or with a keyboard. A particular item can function in the same manner to the user in all applications because the GUI provides standard software routines (e.g., module 125) to handle these elements and report the user's actions. The GUI can further be used to display the electronic service image frames as discussed below.

Computer-readable instructions, for example, program module or node 125, which can be representative of other modules or nodes described herein, are stored on a computer-readable medium and are executable by the processing unit 102 of computer 110. Program module or node 125 may include a computer application. A hard drive, CD-ROM, RAM, Flash Memory, and a USB drive are just some examples of articles including a computer-readable medium.

FIG. 2 depicts a graphical representation of a network of data-processing systems 200 in which aspects of the present invention may be implemented. Network data-processing system 200 can be a network of computers or other such devices, such as mobile phones, smart phones, sensors, controllers, actuators, speakers, "internet of things" devices, and the like, in which embodiments of the present invention may be implemented. Note that the system 200 can be implemented in the context of a software module such as program module 125. The system 200 includes a network 202 in communication with one or more clients 210, 212, and 214. Network 202 may also be in communication with one or more devices 204, servers 206, and storage 208. Network 202 is a medium that can be used to provide communications links between various devices and computers connected together within a networked data processing system such as computer system 100. Network 202 may include connections such as wired communication links, wireless communication links of various types, and fiber optic cables. Network 202 can communicate with one or more servers 206, one or more external devices such as device 204, and a memory storage unit such as, for example, memory or database 208. It should be understood that device 204 may be embodied as a detector device, controller, receiver, transmitter, transceiver, transducer, driver, signal generator, or other such device.

In the depicted example, device 204, server 206, and clients 210, 212, and 214 connect to network 202 along with storage unit 208. Clients 210, 212, and 214 may be, for example, personal computers or network computers, handheld devices, mobile devices, tablet devices, smart phones, personal digital assistants, controllers, recording devices, speakers, MFDs, etc. Computer system 100 depicted in FIG. 1 can be, for example, a client such as client 210 and/or 212 and/or 214.

Computer system 100 can also be implemented as a server such as server 206, depending upon design considerations. In the depicted example, server 206 provides data such as boot files, operating system images, applications, and application updates to clients 210, 212, and/or 214. Clients 210, 212, and 214 and device 204 are clients to server 206 in this example. Network data-processing system 200 may include additional servers, clients, and other devices not shown. Specifically, clients may connect to any member of a network of servers, which provide equivalent content.

In the depicted example, network data-processing system 200 is the Internet, with network 202 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers consisting of thousands of commercial, government, educational, and other computer systems that route data and messages. Of course, network data-processing system 200 may also be implemented as a number of different types of networks such as, for example, an intranet, a local area network (LAN), or a wide area network (WAN). FIGS. 1 and 2 are intended as examples and not as architectural limitations for different embodiments of the present invention.

FIG. 3 illustrates a software system 300, which may be employed for directing the operation of the data-processing systems such as computer system 100 depicted in FIG. 1. Software application 305, may be stored in memory 104, on removable storage 112, or on non-removable storage 114 shown in FIG. 1, and generally includes and/or is associated with a kernel or operating system 310 and a shell or interface 315. One or more application programs, such as module(s) or node(s) 125, may be "loaded" (i.e., transferred from removable storage 114 into the memory 104) for execution by the data-processing system 100. The data-processing system 100 can receive user commands and data through user interface 315, which can include input 116 and output 118, accessible by a user 320. These inputs may then be acted upon by the computer system 100 in accordance with instructions from operating system 310 and/or software application 305 and any software module(s) 125 thereof.

Generally, program modules (e.g., module 125) can include, but are not limited to, routines, subroutines, software applications, programs, objects, components, data structures, etc., that perform particular tasks or implement particular abstract data types and instructions. Moreover, those skilled in the art will appreciate that elements of the disclosed methods and systems may be practiced with other computer system configurations such as, for example, handheld devices, mobile phones, smart phones, tablet devices multi-processor systems, microcontrollers, printers, copiers, fax machines, multi-function devices, data networks, microprocessor-based or programmable consumer electronics, networked personal computers, minicomputers, mainframe computers, servers, medical equipment, medical devices, and the like.

Note that the term "module" or "node" as utilized herein may refer to a collection of routines and data structures that perform a particular task or implements a particular abstract data type. Modules may be composed of two parts: an interface, which lists the constants, data types, variables, and routines that can be accessed by other modules or routines; and an implementation, which is typically private (accessible only to that module), and which includes source code that actually implements the routines in the module. The term module may also simply refer to an application such as a computer program designed to assist in the performance of a specific task such as word processing, accounting, inventory management, etc., or a hardware component designed to equivalently assist in the performance of a task.

The interface 315 (e.g., a graphical user interface 130) can serve to display results, whereupon a user 320 may supply additional inputs or terminate a particular session. In some embodiments, operating system 310 and GUI 130 can be implemented in the context of a "windows" system. It can be appreciated, of course, that other types of systems are possible. For example, rather than a traditional "windows" system, other operation systems such as, for example, a real-time operating system (RTOS) more commonly employed in wireless systems may also be employed with respect to operating system 310 and interface 315. The software application 305 can include, for example, module (s) 125, which can include instructions for carrying out steps or logical operations such as those shown and described herein.

The following description is presented with respect to embodiments of the present invention, which can be embodied in the context of, or require the use of, a data-processing system such as computer system 100, in conjunction with program module 125, and data-processing system 200 and network 202 depicted in FIGS. 1-3. The present invention, however, is not limited to any particular application or any particular environment. Instead, those skilled in the art will find that the system and method of the present invention may be advantageously applied to a variety of system and application software including database management systems, word processors, and the like. Moreover, the present invention may be embodied on a variety of different platforms including Windows, Macintosh, UNIX, LINUX, Android, Arduino, LabView and the like. Therefore, the descriptions of the exemplary embodiments, which follow, are for purposes of illustration and not considered a limitation.

The embodiments disclosed herein are directed to adhesive structures and fabrication methods thereof. One key aspect of the embodiments of the adhesive structures disclosed herein is that they provide very high friction but can also be removed easily. In other words, the shear is much higher than pull-off stress.

Fibrillar adhesive structures, as disclosed herein, can feature spatula-shaped caps (or other such shapes) which serve as an adhesive element. The spatula-shaped caps or tips endow adhesive fiber arrays with on demand adhesion, allowing them to maximize adhesion in a given direction and facilitate near effortless detachment. One aspect of the disclosed embodiments is that off-center spatula ends are provided; a key contributor to directional adhesion.

Thus, in one aspect, a method to manufacture synthetic microfiber adhesives with off-center caps is disclosed. The method entails decoupling the shape and placement dependency between the cap and the stem of the fibrillar adhesive structures, providing endless possibilities in positioning the tip with respect to the stem, the two-dimensional shape, and the material of both the cap and the stem. The methods disclosed herein can be used to tailor the location of the stem on the cap for an entire array of fibrillar adhesive structures and/or within the array, meaning the location of each stem can be selected to connect to each cap at a uniquely defined position, for each such structure in the array of fibrillar adhesive structures.

The resulting fibrillar adhesive structures demonstrate switchable adhesion, relevant for pick and place type applications, and the ability to generate high friction and easy removal. The fibrillar adhesive structures with off-center caps promote easy detachment after strong adhesion including embodiments with both straight and/or bent stems.

While many of the embodiments disclosed herein are directed to micro or nano scale structures, it should be appreciated that the embodiments can include structures, and methods to fabricate structures of any scale. The use and description of micro and/or nano scale structures is meant to be exemplary. The embodiments include fabrication methods that result in structures that possess superior adhesive properties.

Figures 4A, 4B:
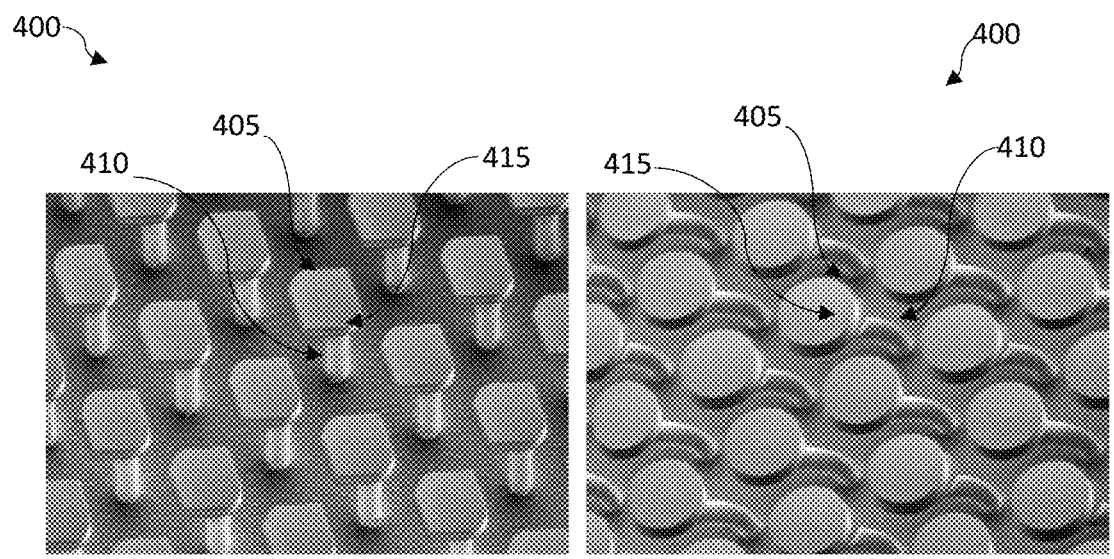
FIG. 4A depicts an illustration of fibrillar adhesive structures, in accordance with the disclosed embodiments.
FIG. 4B depicts an illustration of fibrillar adhesive structures, in accordance with the disclosed embodiments.

FIG. 4A and FIG. 4B illustrate fibrillar adhesion structure arrays 400 in accordance with an aspect of the disclosed embodiments. The array 400 includes an array of adhesion structures 405 which can include stems 410 and caps 415. In certain embodiments, the components of the adhesion structures can be composite with a two-part polyurethane cap 415 and thermoplastic polyurethane (TPU) stems 410.

Note the stems 410 can comprise straight stems or curved stems. The adhesion structures 405 can be configured with asymmetric spatula-shaped caps 415 at the tips of the stems 410 with an overhang on one side of the stem 410. This asymmetric geometry enables anisotropic behavior in normal and shear attachment, allowing for strong attachment but also rapid and easy switching between attachment and detachment. Thus, in certain embodiments the stem/cap configurations can comprise straight fiber stems with off-center caps and bent fiber stems with off-center caps.

The position of the tip with respect to its stem is of particular importance to the degree of anisotropy. Tip contact improves when fibers are moved against the overhang of the terminal end of the stem 410, increasing the adhesion and shear forces. When dragged toward the overhang, a crack opening effect eases the detachment of the adhesion structure. The orientation of pulling defines whether fibers slide with respect to the underlying substrate to which they are attached, or detach through a peeling effect. The inclination angle of the fibers is directly related to the force needed for detachment.

Control of adhesion and detachment is a critical characteristic of the adhesion structures 405 presented herein. In particular the adhesion structures 405 enable an "off" (or removal) state without sacrificing adhesive strengths in the "on" (or attached) state.

Furthermore, anisotropic adhesion can be improved by deliberately introducing defects in the caps 415, by creating asymmetric features including but not limited to, steps in the cap surface, overhangs in the geometry, and/or offset of the caps 415. The disclosed embodiments thus feature alternatives including straight stems 410 featured with mushroom-like caps 415, which have significant resistance to normal pulling, in some cases even higher than natural gecko fibers.

The orientation of the adhesive structures 405 including tilt angle, curvature, and/or the orientation of the caps 415 all contribute to anisotropy. Thus, the fibrillar adhesion structure array 400 of tilted fibers and tilted caps offer excellent anisotropic adhesion.

One aspect of the disclosed embodiments is the ability to orient the caps 415 asymmetrically on the stems 410. Note this can include a common arrangement throughout an array, or an individualized arrangement for each element in the array. The asymmetric configuration, as it relates to anisotropy, is the mechanism that triggers the detachment process. Asymmetric caps as disclosed herein take advantage of the orientation of the fiber stem to nucleate a crack at the interface with the substrate which opens or closes based on the pulling direction of the fiber. While the overhang portion of the cap is still strongly attached, a crack is much easier to create and propagate on the opposite side, mostly with transverse loading of the fibrillar adhesive at the base of the stem 410.

The disclosed embodiments further include a method of fabrication for adhesive fibers comprised of stems with custom located caps. The method allows for fabrication of capped fibers with any desired stem and two-dimensional tip shape. Additionally, precise control in the placement of the cap or tip with respect to the stem is possible using the fabrication method. The control in the placement of the tip in relation to the stem facilitates a high degree of control in switchable adhesion. The objective of the method is to decouple the shape and placement dependency between the cap and the stem, control the degree of eccentricity of the cap in relation to the stem, and therefore control the degree of dependence of adhesion on the loading direction, maximize adhesive performance in a desired direction while enabling easy release.

Figure 5:
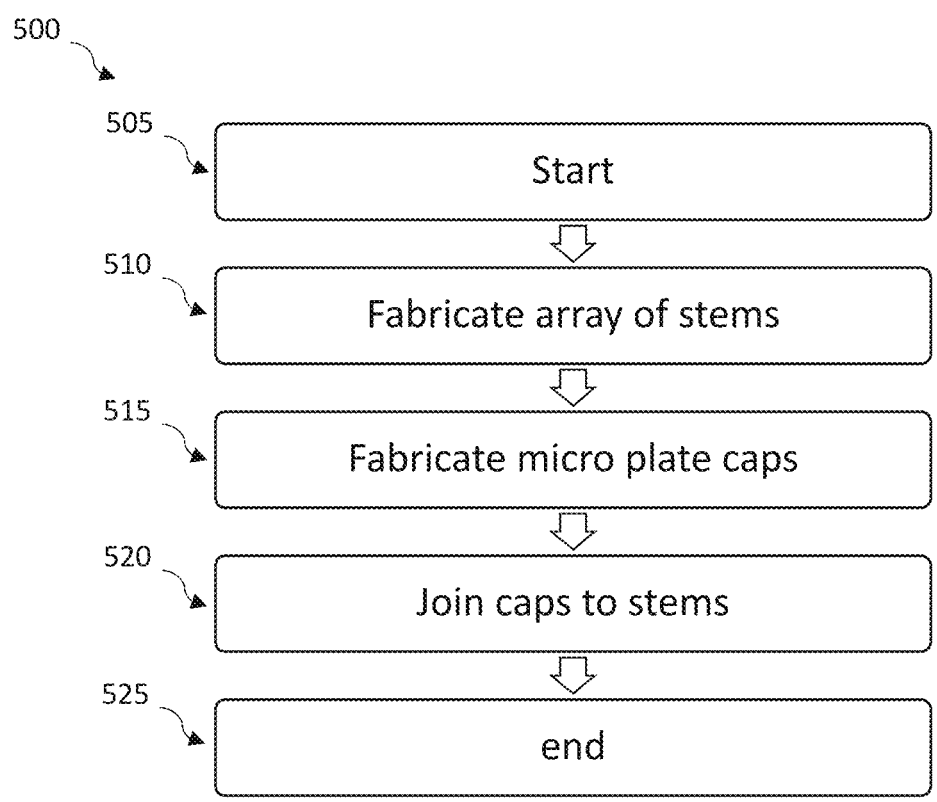
FIG. 5 depicts a method for fabricating fibrillar adhesive structures, in accordance with the disclosed embodiments.

In certain embodiments, the fabrication methods for fibrillar adhesive arrays with asymmetric caps, which can include one or more adhesive structures as illustrated in FIG. 4, can include three basic steps. FIG. 5 illustrates a fabrication method 500 which begins at step 505. At step 510 an array of one or more fibers or stems can be created. Next at step 515, thin micro plates to be used as caps can be fabricated. The final step 520 includes attaching the caps to the stems at a desired relative position to create capped fibers. The method ends at 525. It should be appreciated that one more steps disclosed herein which require precise alignment, positioning and associated machinery, can use a computer system as disclosed in FIGS. 1-3, as necessary for controlling such parameters.

FIG. 6A illustrates steps associated with the fabrication of the fibers as illustrated at step 510 of method 500. The method entails generating stems on a wafer. In certain embodiments, the wafer can comprise 4-inch Si-wafer, but other sizes and materials can also be used.

The wafer can include cylindrical fibers (for example, fibers of 85 µm in length, 20 µm in diameter and configured in a square pattern with center-to-center distance of 80 µm). The dimensional characteristics of the fibers can be adjusted according to the application and will define the ultimate stem shape. In certain embodiments the fibers are evenly distributed on a peg, which can comprise an acrylic peg.

Next a mold 605, which can be made of Polydimethylsiloxane (PDMS, Sylgard 184 Silicone Elastomer, Dow Corning, 10:1 weight ratio) or other such material, can be fabricated from the Si-wafer containing the stem shapes. The mold 605 can comprise the negative of the shape defined by the wafer. The mold 605 can be placed on a glass slide. An acrylic peg, or pegs, can then be cut from a acrylic sheet (in certain embodiments the peg can be transparent). The acrylic peg(s) serve as the backing for the fiber arrays.

At step (a), a piece of film 610, which can comprise thermoplastic urethane (TPU) film (UAF 438, Adhesive Films, Inc.) with an elastic modulus of, for example, ~2.5 MPa (or any other such film), can be cut to the size of the acrylic peg and placed on the top of the PDMS mold 605.

Next, at step (b) the mold 605 with the TPU film 610 on top is heated with a heating source 615, which can comprise a hot plate, to approximately 130° C. and held at that temperature for approximately one hour. During this time the TPU film melts. The time and temperature requirements can be set to ensure the film 610 melts completely and also to ensure removal of any air trapped between the film 610 and the mold 605.

Meanwhile the acrylic peg 620 can be preheated to prevent cooling of the melted film 610, once in contact and to ensure better bonding with the melted film 610 material. Once the film 610 melts, the preheated acrylic peg 620 can be placed on the melted TPU film 610, as shown at step (c). The peg 620 can be pressed gently against the film 610 and mold to ensure clean uniform contact. The gentle pressure between the peg 620 to the film 610 ensure a quality bond, and fills holes in the mold 605 with the melted film 610.

The arrangement is then removed from the hot plate 615 and cured by being held at room temperature for approximately 5 hours to ensure that TPU film 610 cools down to room temperature. The resulting TPU-acrylic peg assembly 625 is then removed from the mold, at step (d), to obtain the stems 410, as illustrated in FIGS. 6A and 6B.

The next step 515 illustrated in the method 500 includes construction of caps such as caps 415. The disclosed systems of fibers with off-center caps requires the attachment of the stems to the caps. Therefore, the center-to-center distance between each stem and cap in the respective array of stems and array of caps must be the same to ensure spatial matching.

Figure 7A:
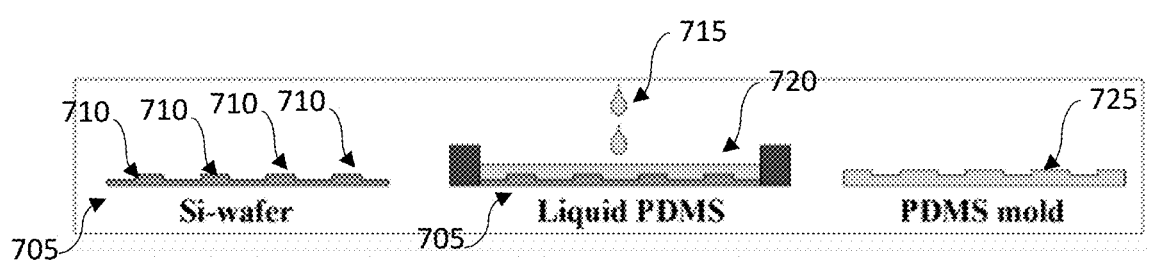
FIG. 7A depicts a block diagram of a fabrication method for a cap mold, in accordance with the disclosed embodiments.
Figure 7B:
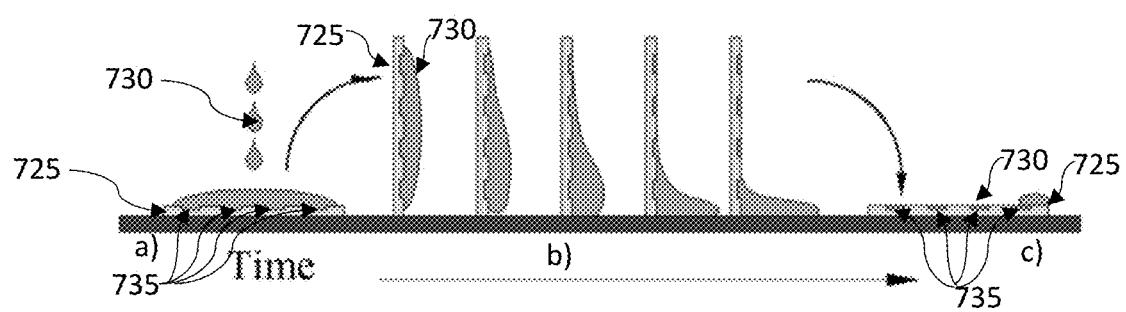
FIG. 7B depicts a block diagram of a fabrication method for caps, in accordance with the disclosed embodiments.

FIGS. 7A and 7B illustrate steps associated with method step 515 of FIG. 5, namely, fabrication of the plates to be used as caps. This step requires a second wafer 705, which can be an Si-wafer containing the positive shape 710 of protrusions associated with the caps. In certain embodiments, the protrusions can be 10 µm tall and can be distributed at the same center-to-center distance as the stem mold. It should be appreciated that the protrusions can also be other shapes as required for the desired application.

Liquid PMDS 715 can be poured over the wafer 705 and cured at room temperature for approximately 36 hours. The PMDS forms a film 720 on the Si-wafer 705, which can serve as the negative mold 725 of the caps. It should be appreciated that caps of various shapes and sizes can be created. The shape of the mold 725 can thus be selected such that the resulting caps are of the desired size and shape.

FIG. 7B illustrates steps associated with the fabrication of the caps 415 using the mold 725 as illustrated. The caps 415 can be fabricated from a liquid 730 which can comprise a two-compound resin and hardener liquid polyurethane (e.g. TC 9445, BJB Enterprises), although other materials can be used in other embodiments. The liquid 730 can be poured in the PDMS mold 725. One important aspect of the disclosed method is that just the depressions 735 of the mold 725 are filled with material 730; very little or no material 730 should be present on the surface of the mold 725 outside the depressions 735.

Material selections in this embodiment can be important. PDMS surfaces have low affinity to polyurethanes and allow for liquid polyurethanes to drain off quickly. Therefore, a gravity-controlled process can be used to remove the excess of material 730 from the surface of the mold 725, leaving just the depressions 735 filled with the polyurethane material 730.

In an exemplary embodiment, once the liquid material 730 has filled the depressions 735, the mold 725 can be moved from a substantially horizontal orientation, as shown at (a) to a substantially vertical orientation as shown at (b). The liquid material 730 on the surface of the mold 725 drains down and off the surface. After draining the material 730 from the surface of the mold 725, the PDMS mold 725 can be returned to its face up horizontal orientation, and placed on a glass slide (e.g. a 2 in.×4 in. glass slide) as shown at (c). This arrangement can then be placed in a vacuum chamber to ensure that the depressions 735 of the mold 725 are completely filled with material 730.

The key is to eliminate enough material 730 on the surface of the mold 725 so that the material does not form a connection between respective caps in the array of caps. After 15 minutes in the vacuum chamber, most of the material 730 will have been removed from the surface. Small droplets of material 730 may remain on the surface of the mold 725 between the depressions, and will not affect the remaining steps, provided that they are too small to create a connective layer between material in the depressions.

Figure 8A:
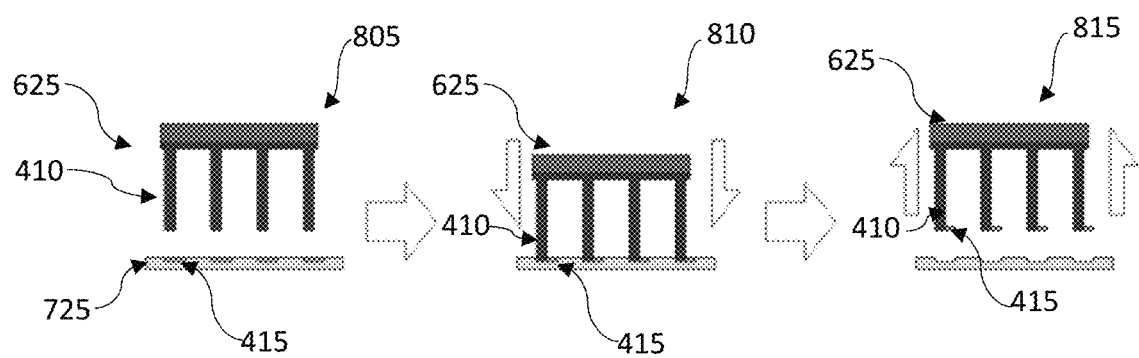
FIG. 8A depicts a block diagram of a fabrication method for connecting the stems and caps, in accordance with the disclosed embodiments.
Figure 8B:
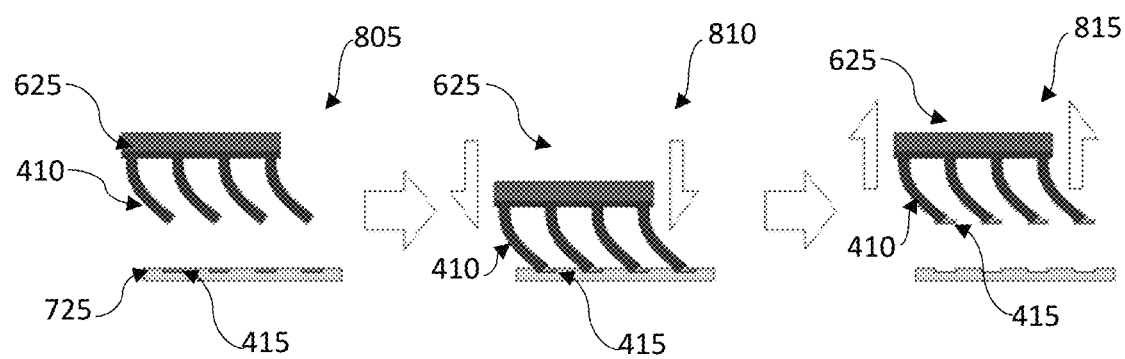
FIG. 8B depicts a block diagram of a fabrication method for connecting the stems and caps, in accordance with the disclosed embodiments.

At this point, the caps 415 have been formed in the mold 725 and are ready for attachment to the stems as shown at step 520 of method 500. FIG. 8A illustrates this method for straight stems and FIG. 8B illustrates the method with bent or curved stems. The methods are essentially the same. The stem array can be manually or automatically, adjusted at 805 and then placed at 810 such that the stems 410 are in contact with the material in the depressions 735 of the mold 725.

Positioning the stems 410 with respect to the caps 415 and the spatial match between them can be facilitated with an optical microscope. The process can further be automated by a computer system which uses an imaging system to determine the correct orientation of the stems 410 with respect to the caps 415 and then places the stems accordingly.

Once the TPU-acrylic peg assembly 625 is properly positioned so that the stems and caps are connected, the completed assembly 750 can be cured. In certain embodiments, the curing process can go on for a minimum of 9 hours at room temperature. After curing, the completed assembly 750 can be removed at step 815 from the mold 725 with the stems 410 now secured to the spatula caps 415. Note, the positioning of the stem sample into the caps mold is the same for both straight and bent stems.

The bifurcated processes for the fabrication of the caps 415 and stems 410 enables numerous combinations of materials and geometries for both the stems 410 and caps 415. For example, FIG. 9 illustrates four examples of straight off-center cap fibers with various cap shapes, produced using the proposed techniques.

Figure 9:
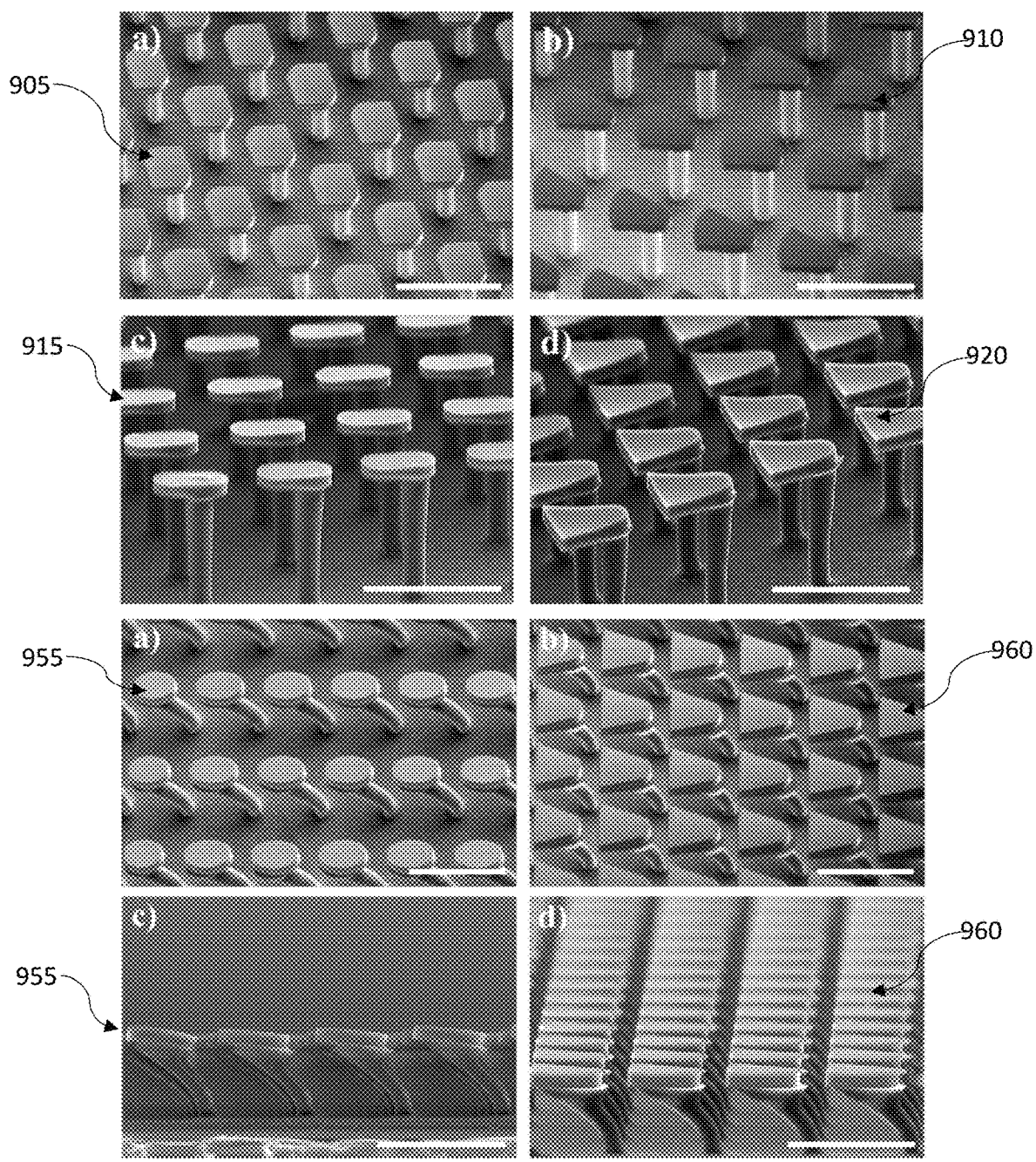
FIG. 9 depicts images of fibrillar adhesive structures, in accordance with the disclosed embodiments.

Examples of bent off-center cap fibers are shown in FIG. 9. Examples of straight microfibers featuring four different cap shapes that can include: leaf shapes as shown in 905, rounded pie-slices as shown in 910, rounded rectangles as shown in 915, and rounded triangles in 920. Examples of bent microfibers featuring off-center cap shapes can include elliptical shapes in 955 and rounded triangles in 960.

It should be understood that it is possible to fabricate larger samples using larger stem and cap molds replicated from a typical 4 in. or 6 in. wafer. However, certain embodiments disclosed herein may rely on the flatness of the cap mold and the stem sample and ensuring flatness at larger scales should be maintained. Another factor, independent of the size of the molds is shrinkage. Since the disclosed method requires several casting steps, material shrinkage during curing must be addressed. In certain embodiments, curing can be controlled with time and temperature such that the match between the stem sample and the cap mold is maintained in terms of the center-to-center spacing of features.

Figure 10A:
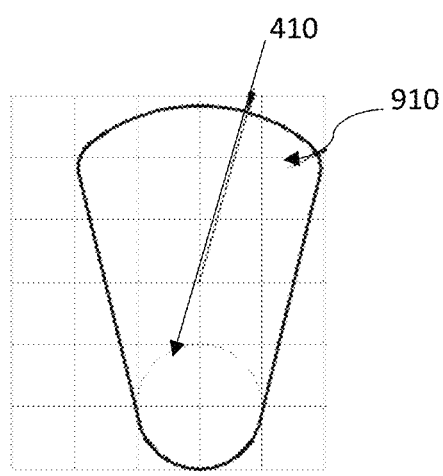
FIG. 10A depicts an exemplary shape for caps, in accordance with the disclosed embodiments.
Figure 10B:
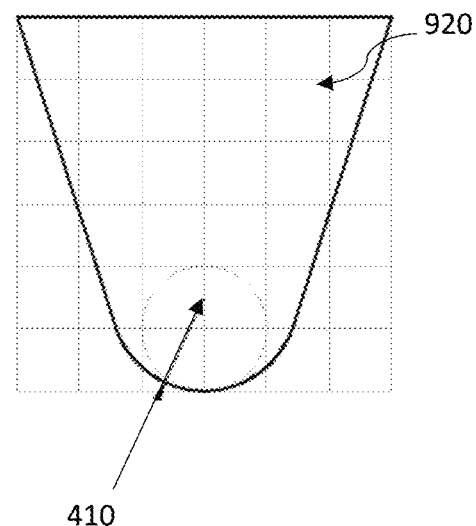
FIG. 10B depicts an exemplary shape for caps, in accordance with the disclosed embodiments.

Exemplary cap shapes are illustrated in FIGS. 10A and 10B. As illustrated, in certain embodiments, the 80 µm center-to-center distance and the 20 µm diameter of the stems can be taken into account to define the geometry of the caps. The grid provided in FIGS. 10A and 10B is provided to illustrate relative area with respect to the shapes. In FIG. 10A, a rounded pie-slice 910 is shown. In FIG. 10B, a rounded triangle shape 920 is shown. The two cap shapes can have exemplary geometry as illustrated. The intended relative off-center position of the stem in relation to the cap is also detailed in the figures. Positioning of the stem tip at the base of the cap produces the desired overhang cap shape, similar to spatula observed in natural fibrillar adhesives.

Figure 11A:
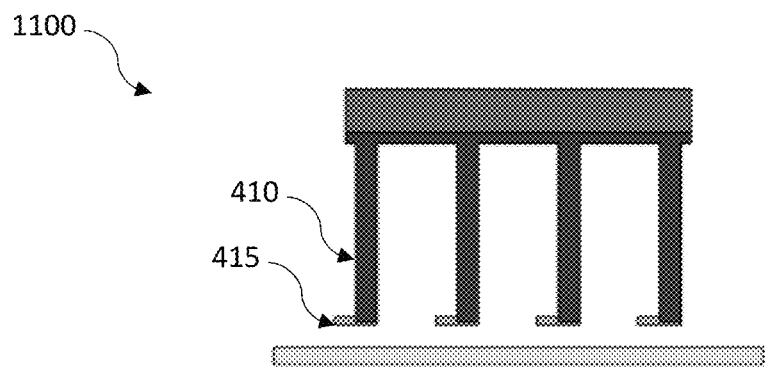
FIG. 11A depicts fibrillar adhesive structures with straight stems, in accordance with the disclosed embodiments.

Fibers with overhang on one side, such as the straight fibers with off-center caps 1100 are illustrated in FIG. 11A. This arrangement includes stems 410 and off-center caps 415. The arrangement 1100 has a preferred direction for detachment. That is, a relative motion of the fibers toward the overhang can facilitate easier detachment due to the crack opening effect on the blunt side of the fiber. This effect is less pronounced when the fiber is unloaded normal to the substrate, leading to a higher pull-off force.

Figure 11B:
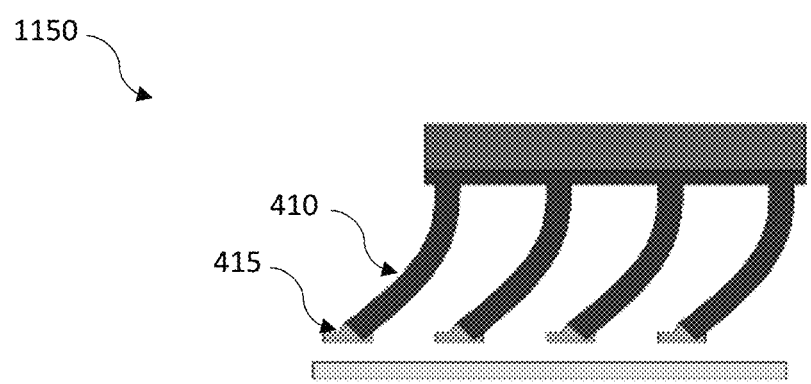
FIG. 11B depicts fibrillar adhesive structures with curved or bent stems, in accordance with the disclosed embodiments.

Likewise, FIG. 11B illustrates bent off-center cap fibers 1150. The bent off-center cap fibers 1150 generally include bent stems 410 and off-center caps 415. This arrangement 1150 offers the ability to generate high friction.

Experimental results show that the performance of adhesion of the disclosed fibers with off-center caps is highly dependent on the direction of the applied displacement. After a relative maximum, the adhesion force gradually decreases in magnitude due to the progressive detachment of the fibers. A relative maximum pull-off is followed by a sudden drop in the reaction force, indicating quicker detachment. It should be noted that there is a difference in the normal force required to detach the fibers from the substrate depending on the type of removal. The difference in pull-off force suggests that pick & place operations using fibrillar adhesion systems disclosed herein, in particular straight fibers with off-center caps, can be achieved by employing different unloading paths. The disclosed straight fibers with off-center caps are suitable to get strong adhesion when pulled in the normal direction with respect to the substrate and relatively weaker adhesion when pulled in angled fashion.

Figure 12:
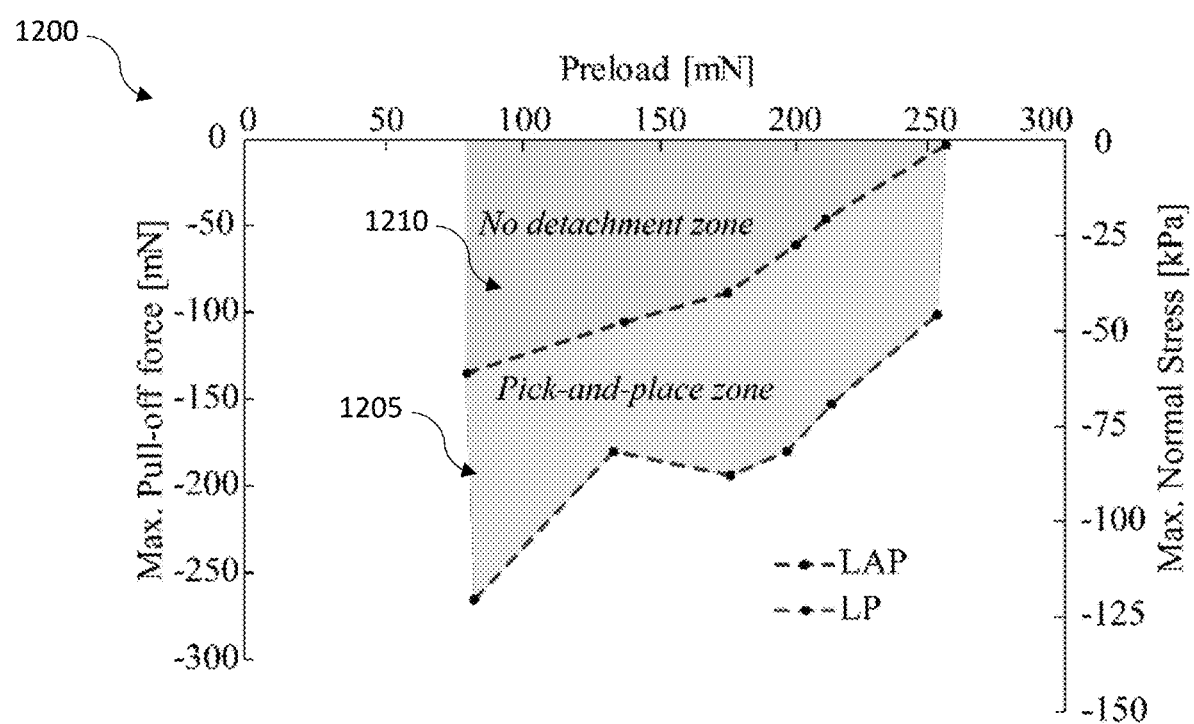
FIG. 12 depicts a chart illustrating fibrillar adhesive structure pull off forces and associated pick and place operational ranges, in accordance with the disclosed embodiments.

For many applications, fibrillar adhesive structures need to be able to quickly switch between strong adhesion and easy release, to be suitable for pick & place applications. The degree of switchable adhesion depends on the amount of initial compressive force (preload) to generate contact between surfaces. In experimental tests of the disclosed systems, pull-off forces between Load-Pull and Load-Angled Pull tests, as a function of preload, ranged between 70 mN and 260 mN. The area 1205 in chart 1200, illustrated in FIG. 12, between the pull-off loads designates a pick-and-place zone. The embodiments disclosed herein offer pick and place applicability for an object whose weight corresponds to this region. Weights corresponding to the region 1210 in chart 1200 can be picked up but do not exhibit optimal release for pick and place applications.

Thus, the methods and systems disclosed herein exhibit high friction and are easily removable from the adhering surface. For example, bent fibers with off-center caps provide high resistance in the shear direction. As the lateral sliding continues, shear force levels-off and remains fairly constant until the system is pulled away from the surface. On the other hand, normal force becomes negative once lateral displacement is applied. The relation between maximum shear force and normal pull-off force can be approximately 3:1.

Furthermore, shear force increases with preload. However, normal force becomes more positive switching from tensile to compressive. This illustrates that according to aspects of the embodiments, shear is not only due to adhesion, but the compressive normal force also contributes to shear, as in Coulomb friction.

For fibrillar adhesives with fixed contact area, a relationship between shear force Fs, the preload Fp, and normal force, Fn in the Load-Drag-Pull tests of the disclosed embodiments, during the drag stage of can be captured according to equation (1):

$$\zeta \equiv \frac{F_p - F_n}{F_s} \cong \text{constant.} \tag{1}$$

Bent fibers with off-center caps accomplish full contact for a wide range of preloads. Therefore, the contact area is independent of preload and the relationship described in Equation (1) holds. The relationship in Equation (1) accounts for the effect of preload in the adhesive friction.

The highest pull-off stress obtained from the straight fibers with off-center caps disclosed herein, can be approximately 30 kPa. The bent fibers with off-center caps can also provide about 30 kPa in shear. Performance with both the straight and bent fiber designs can be improved with the use of softer cap materials. Indeed, the principal shape of so-called mushroom caps, which forms the basis for our designs, can result in adhesive strengths in excess of 100 kPa on smooth surfaces.

The disclosed systems and methods are drawn to a technique for the fabrication of fibers with off-center caps. Using this method, geometrical parameters such the shape or the positioning of the caps can be conceived independently of the material and geometry of the fiber stem. This fabrication strategy provides an unprecedented flexibility in the mechanical design of fibrillar structures. The disclosed technique also works for curved fibers with the same flexibility as for straight fibers. This technique also provides flexibility in terms of the materials used. The material for the caps does not need to be the same as the material of the caps. However, materials of similar chemical composition can be chosen in order to ensure a strong bond at the stem-cap interface.

The disclosed systems with off-center caps on straight fibers increases the dependency of fiber detachment on the direction pulling. Load-Pull test results show high resistance to detachment when fibers are pulled away normal to the target surface. The normal pulling direction distributes stress more evenly and starts detachment from the side of the fibers without the overhang relatively late. When these fibers are pulled in an angled fashion, the resulting bending from the lateral component of the motion gives rise to a quick separation, resulting in a smaller pull-off force. The disclosed embodiments are thus suitable for direction-controlled pick & place application. A higher degree of difference can be achieved by moving the fiber array laterally in the direction of the tip overhang, with minimal normal displacement.

A different type of response can be realized in bent fibers with off-center caps. These fibers do not exhibit high resistance to pulling in the normal direction. That is to say that they are easier to remove from a target surface. However, when dragged away from the overhang direction, bent fibers reach a relatively high and even shear resistance. The magnitude of the shear force is about six times the normal force and three times the pull-off force. The ratio of the difference between preload and normal force to shear force is constant. Thus, bent fibers with off-center caps are ideal for applications where high friction and low adhesion is desirable such as in robotic locomotion and fragile part transfer in the semiconductor industry.

Based on the foregoing, it can be appreciated that a number of embodiments, preferred and alternative, are disclosed herein. For example, in certain embodiments, a fabrication method comprises forming a stem mold, generating an array of at least one stems using the stem mold, forming a cap mold, generating an array of at least one caps using the cap mold, adhering the array of at least one stems to the array of at least one caps, and removing the cap mold wherein the resulting system comprise an array of at least one fibrillar adhesive structures.

In an embodiment, the method further comprises aligning the array of at least one stem to contact the at least one cap at a desired location on the cap. In an embodiment, a spacing between each of the at least one stem in the array of at least one stem is substantially the same as the spacing between each of the at least one caps in the array of at least one caps.

In an embodiment, generating an array of at least one caps further comprises distributing a cap material into the cap mold while the cap mold is on a substantially horizontal surface, reorienting the cap mold into a substantially vertical position, wherein excess cap material drains off the cap mold, and reorienting the cap mold back into a substantially horizontal position. In an embodiment, the method further comprises subjecting the cap mold to a vacuum.

In an embodiment, generating an array of at least one stem using the stem mold further comprises placing a stem material on the stem mold, heating the stem mold, and compressing the stem material with a peg. The method further comprises curing the stem material in the stem mold.

In an embodiment, the method further comprises curing the array of at least one fibrillar adhesive structures after the array of at least one stems is adhered to the array of at least one caps. In an embodiment, the array of at least one stems comprises the peg with the at least one stems extend therefrom.

In an embodiment, the array of at least one stems comprises one of at least one curved stem and at least one straight stem.

In an embodiment, a gripping system comprises an array of at least one stems, the array of at least one stems being cast from a stem mold and an array of at least one caps bound to the array of at least one stems, the array of at least one caps being cast from a cap mold wherein the caps are asymmetrically aligned on the stems. In an embodiment, each of the array of at least one stems comprises one of at least one curved stem and at least one straight stem.

In an embodiment, the system further comprises a peg, the peg comprising a substrate upon which the array of at least one stems are mounted. In an embodiment, the peg comprises an acrylic peg.

In an embodiment, each stem in the array of at least one stem comprises a thermoplastic urethane stem. In an embodiment, the cap in the array of at least one cap comprises a two-compound resin and hardener liquid polyurethane.

In another embodiment a method for fabricating fibrillar adhesive structures comprises fabricating a stem mold, the stem mold comprising a wafer with at least one stem shaped formation, fabricating a cap mold, the cap mold comprising a wafer with at least one cap shaped depression, creating an array of at least one stems using the stem mold, creating an array of at least one caps using the cap mold, aligning the centers of the at least one stems in the array of at least one stems to a desired position on the at least one cap in the array of at least one caps, bonding the at least one stem in the array of at least one stems to the at least one cap in the array of at least one caps to form the fibrillar adhesive structure, and curing the fibrillar adhesive structure.

In an embodiment, creating an array of at least one caps further comprises distributing a cap material into the cap mold while the cap mold is on a substantially horizontal surface, reorienting the cap mold into a substantially vertical position, wherein excess cap material drains off the cap mold, and reorienting the cap mold back into a substantially horizontal position. In an embodiment, generating an array of at least one stems using the stem mold further comprises placing a stem material on the stem mold, heating the stem mold, compressing the stem material with a peg, and curing the stem material in the stem mold. In an embodiment, the method further comprises selecting the cap material and the stem material to be the same material. In certain embodiments, the cap material and the stem material can be selected to materials that form a bond when cured.

It will be appreciated that variations of the above-disclosed and other features and functions, or alternatives thereof, may be desirably combined into many other different systems or applications. Also, it should be appreciated that various presently unforeseen or unanticipated alternatives, modifications, variations or improvements therein may be subsequently made by those skilled in the art which are also intended to be encompassed by the following claims.

What is claimed is:

1. A fabrication method comprising:
    forming a stem mold;
    generating an array of at least one stems using the stem mold;
    forming a cap mold;
    generating a separate array of at least one caps using the cap mold;
    adhering each of the at least one stems in the array of at least one stems to a cap in the separate array of at least one caps; and
    removing the cap mold wherein a resulting system comprises an array of at least one fibrillar adhesive structures.

2. The fabrication method of claim 1 further comprising:
    aligning the array of at least one stems to contact the at least one caps at a desired location on the cap.

3. The fabrication method of claim 1 wherein a spacing between each of the at least one stems in the array of at least one stems is substantially the same as a spacing between each of the at least one caps in the separate array of at least one caps.

4. The fabrication method of claim 1 wherein generating a separate array of at least one caps further comprises:
    distributing a cap material into the cap mold while the cap mold is on a substantially horizontal surface;
    reorienting the cap mold into a substantially vertical position, wherein excess cap material drains off the cap mold; and
    reorienting the cap mold back into a substantially horizontal position.

5. The fabrication method of claim 4 further comprising:
    subjecting the cap mold to a vacuum.

6. The fabrication method of claim 1 wherein generating an array of at least one stems using the stem mold further comprises:
    placing a stem material film on the stem mold;
    heating the stem mold to melt the stem material film; and
    compressing the stem material with a peg.

7. The fabrication method of claim 6 further comprising:
    curing the stem material in the stem mold.

8. The fabrication method of claim 6 wherein the array of at least one stems comprises the peg with the at least one stems extending therefrom.

9. The fabrication method of claim 1 further comprising:
    curing the array of at least one fibrillar adhesive structures after the array of at least one stems is adhered to the separate array of at least one caps.

10. The fabrication method of claim 1 wherein the array of at least one stems comprises one of:
    at least one curved stem; and
    at least one straight stem.

11. A method for fabricating a fibrillar adhesive structure comprising:
    fabricating a stem mold, the stem mold comprising a wafer with at least one stem shaped formation;
    fabricating a cap mold, the cap mold comprising a wafer with at least one cap shaped depression;
    creating an array of at least one stems using the stem mold;
    creating a separate array of at least one caps using the cap mold;
    aligning the centers of the stems in the array of at least one stems to a desired position on the caps in the separate array of at least one caps;
    bonding the at least one stem in the array of at least one stems to the at least one cap in the separate array of at least one caps to form the fibrillar adhesive structure; and
    curing the fibrillar adhesive structure.

12. The method for fabricating a fibrillar adhesive structure of claim 11 wherein creating a separate array of at least one caps further comprises:
    distributing a cap material into the cap mold while the cap mold is on a substantially horizontal surface;
    reorienting the cap mold into a substantially vertical position, wherein excess cap material drains off the cap mold; and
    reorienting the cap mold back into a substantially horizontal position.

13. The method for fabricating fibrillar adhesive structures of claim 12 wherein generating an array of at least one stems using the stem mold further comprises:
    placing a stem material on the stem mold;
    heating the stem mold;
    compressing the stem material with a peg; and
    curing the stem material in the stem mold.

14. The method for fabricating fibrillar adhesive structures of claim 13 further comprising:
    selecting the cap material and the stem material to be materials that form a bond when cured.

* * * * *